United States Patent
Muller

(10) Patent No.: US 9,581,637 B2
(45) Date of Patent: Feb. 28, 2017

(54) APPARATUS AND METHOD FOR TESTING WINDING RESISTANCES OF TRANSFORMERS BASED ON AN INDUCTIVE VOLTAGE DROP

(75) Inventor: Marc Muller, Lausen (CH)

(73) Assignee: Haefely Test AG, Basel (CH)

( * ) Notice: Subject to any disclaimer, the term of this patent is extended or adjusted under 35 U.S.C. 154(b) by 559 days.

(21) Appl. No.: 14/116,476

(22) PCT Filed: May 7, 2012

(86) PCT No.: PCT/CH2012/000098
§ 371 (c)(1),
(2), (4) Date: Nov. 8, 2013

(87) PCT Pub. No.: WO2012/155278
PCT Pub. Date: Nov. 22, 2012

(65) Prior Publication Data
US 2014/0191774 A1     Jul. 10, 2014

(30) Foreign Application Priority Data

May 17, 2011  (WO) ................ PCT/CH2011/000113

(51) Int. Cl.
*G01R 31/06* (2006.01)
*G01R 27/14* (2006.01)
*G01R 31/02* (2006.01)

(52) U.S. Cl.
CPC ............. *G01R 31/06* (2013.01); *G01R 27/14* (2013.01); *G01R 31/027* (2013.01)

(58) Field of Classification Search
CPC .. G01R 31/027; G01R 31/025; G01R 15/185; G01R 31/346; G01R 35/02;
(Continued)

(56) References Cited

U.S. PATENT DOCUMENTS

| | | | | |
|---|---|---|---|---|
| 2,890,410 A | * | 6/1959 | Holcomb | G01R 31/027 324/547 |
| 3,684,951 A | * | 8/1972 | Harrold | G01R 31/1227 324/509 |

(Continued)

OTHER PUBLICATIONS

International Search Report for corresponding International Application No. PCT/CH2012/000098 dated Jun. 13, 2012.
(Continued)

*Primary Examiner* — Vinh Nguyen
(74) *Attorney, Agent, or Firm* — Renner, Otto, Boisselle & Sklar, LLP.

(57) ABSTRACT

An apparatus for measuring winding resistances of windings in a delta-connected transformer includes at least a first and a second DC current source connected each between the phase ends of a first and a second leg respectively of the primary side of the transformer and at least a third DC current source connected between two nodes of the secondary side of the transformer. Furthermore, a method for measuring a winding resistance of windings in delta-connected transformers includes the steps of applying a first and a second measuring current to each one of two corresponding legs, applying a third measuring current between two nodes of a pair of windings on the secondary side and measuring at least a winding resistance of the winding between said nodes on the secondary side of the transformer and/or the winding resistance of a leg of the primary side as soon as an inductive voltage drop in the windings substantially equals zero.

17 Claims, 2 Drawing Sheets

(58) Field of Classification Search
CPC .... G01R 15/183; G01R 19/165; G01R 29/20;
G01R 31/06; G01R 15/181; G01R 27/08;
G01R 27/16; G01R 31/024; G01R 31/34;
G01R 15/18; G01R 27/02; G01R 31/041;
G01R 15/186; G01K 7/183; H01R 13/71;
H01R 2201/20; H02M 3/33507; H02M
3/3376; H02M 7/527; G01H 15/00; H02N
11/002
See application file for complete search history.

(56) References Cited

U.S. PATENT DOCUMENTS

| | | | | |
|---|---|---|---|---|
| 3,987,393 | A * | 10/1976 | Knauer | G01R 19/16547 324/102 |
| 5,276,402 | A | 1/1994 | Schucht | |
| 2013/0176021 | A1 * | 7/2013 | Udagawa | G01R 33/0064 324/244 |

OTHER PUBLICATIONS

Jaya et al., "Novel method to determine insulation temperature during dielectric measurements on power transformers", Universitites Power Engineering Conference (AUPEC), 2010 20th Australasian, IEEE, Dec. 5, 2010, pp. 1-5.
Erbrink et al., "On-load tap changer diagnosis: Interpretation of dynamic resistance deviations", Electrical Insulation (ISEI), Conference Record of the 2010 IEEE International Symposium on, IEEE, Piscataway, NJ, Jun. 6, 2010, pp. 1-5.

\* cited by examiner

APPARATUS AND METHOD FOR TESTING WINDING RESISTANCES OF TRANSFORMERS BASED ON AN INDUCTIVE VOLTAGE DROP

CROSS REFERENCE TO RELATED APPLICATIONS

This application is a national phase of International Application No. PCT/CH2012/000098, filed May 7, 2012, and published in the English language which claims priority to PCT/CH2011/000113, filed May 17, 2011, the disclosures of which are incorporated herein by reference in their entirety.

TECHNICAL FIELD

The present invention is related to an apparatus and a method for testing transformers according to the respective independent claims. In particular, the invention describes a method and apparatus for testing winding resistances of transformers, particularly Delta-connected transformers.

BACKGROUND ART

The phenomenon of ferromagnetic saturation plays an important role in the prior art high current transformer resistance meters. The main inductance L of the transformer drastically drops when the magnetic core is saturated. This effect facilitates it to measure the ohmic resistance after the inductive voltage drop has decayed to zero.

The resistance of Delta-connected windings in transformers is difficult to measure and it can be very time consuming. The reason for this is an exponential decreasing balancing process in the Delta-winding. This balancing process has a time constant of $\tau=L/R$. The smaller the DC-resistance R of the winding, the longer is the duration of this process. On large generator transformers, this balancing process may for example take several minutes up to one hour. The vector group of generator transformers is usually 'YNd' with any phase shift (YNd1, YNd3, YNd5, YNd7, YNd9 and YNd11). The identifier 'Y' means that the primary-side topology of the transformer is a star topology, the identifier 'N' means that the transformer has a neutral point, the identifier 'd' means that the secondary-side topology of the transformer is a Delta-topology and the subsequent number indicates the factor for the calculation of the phase shift between the phases of the transformer legs by multiplying the number with an angle of 30°. For example, in an 'YNd3'-configuration the phase shift is of 90°.

In existing solutions like high current testers, the measurement time is reduced by using measuring currents which are higher than the core saturation level. This is done because the main inductance L becomes smaller and thus the time constant $\tau$ becomes shorter, as the winding resistance R is constant at a given temperature.

These high current testers of the prior art are large and heavy devices utilizing massive conductors and connectors to supply 50 A or more to saturate the core. Moreover, on large power transformers, the saturation current can easily reach 100 A or more. Therefore, even such high current measurement devices cannot saturate the core in case they cannot supply the required current.

Thus, a common practice is to drive the measuring current simultaneously through the secondary-side and the primary side winding of the transformer to be tested using a series connection of them. The current in the primary side winding assists in saturating the transformer core, when measuring the secondary side winding. Because the turns ratio $\gamma$ ($\gamma=N1/N2$) is usually greater or equal to 10 on generator transformers, wherein N1 denotes the primary side number of turns and N2 the secondary side number of turns, the current necessary to saturate the core is ten times or more smaller on the primary side than on the secondary side. The result of this practice is a decreased measuring time.

DISCLOSURE OF THE INVENTION

Hence, it is a general object of the invention to provide a measurement apparatus and method which allow a further reduction of the measurement time.

Now, in order to implement these and still further objects of the invention, which will become more readily apparent as the description proceeds, the apparatus for measuring at least a winding resistance of windings in a Delta-connected transformer is manifested by the features that it comprises at least a first and a second DC current source connected each between the phase ends of a first and a second leg respectively of the primary side of the transformer. Furthermore, it comprises at least a third DC current source connected between two nodes of the secondary side of the transformer. It further comprises a first and/or a second voltage measurement device. A first DC voltage drop on a third leg of the primary side is measurable by the first voltage measurement device and/or a second DC voltage drop on a leg of the secondary side of the transformer is measurable by the second voltage measurement device.

The method for measuring a winding resistance of windings in Delta-connected transformers comprises the steps of:

applying a first and a second measuring current ($I_1/2$) to each one of two corresponding legs (C, B) of the primary side (P) of the transformer by means of a first and a second DC current source (S1, S2), applying a third measuring current ($I_2$) between two nodes (b, a) of a pair of windings on the secondary side (S) of the transformer by means of a third current source (S3), measuring at least a winding resistance of the winding between said nodes (b, a) on secondary side (S) of the transformer and/or the winding resistance of a leg (A) of the primary side (P) as soon as an inductive voltage drop in the windings substantially equals zero.

The method according to the invention is preferably carried out by the apparatus according to the invention.

In a preferred embodiment, the first and the second measurement currents are equal and amount each to the half of a saturation current for the core of the transformer.

The invention has a wide applicability for testing of transformers of different sizes, configurations and ratings. The invention is particularly suitable to test power, distribution and/or instrument transformers as well as generators and motors. Furthermore, as will be explained in the description of preferred embodiments, the invention makes it possible to test a variety of transformer configurations without having to change connections to the device and test (DUT), this being the transformer itself, for each test.

BRIEF DESCRIPTION OF THE DRAWINGS

The invention will be better understood and objects other than those set forth above will become apparent when consideration is given to the following detailed description thereof. Such description makes reference to the annexed drawings, wherein.

MODES FOR CARRYING OUT THE INVENTION

Figure 1:
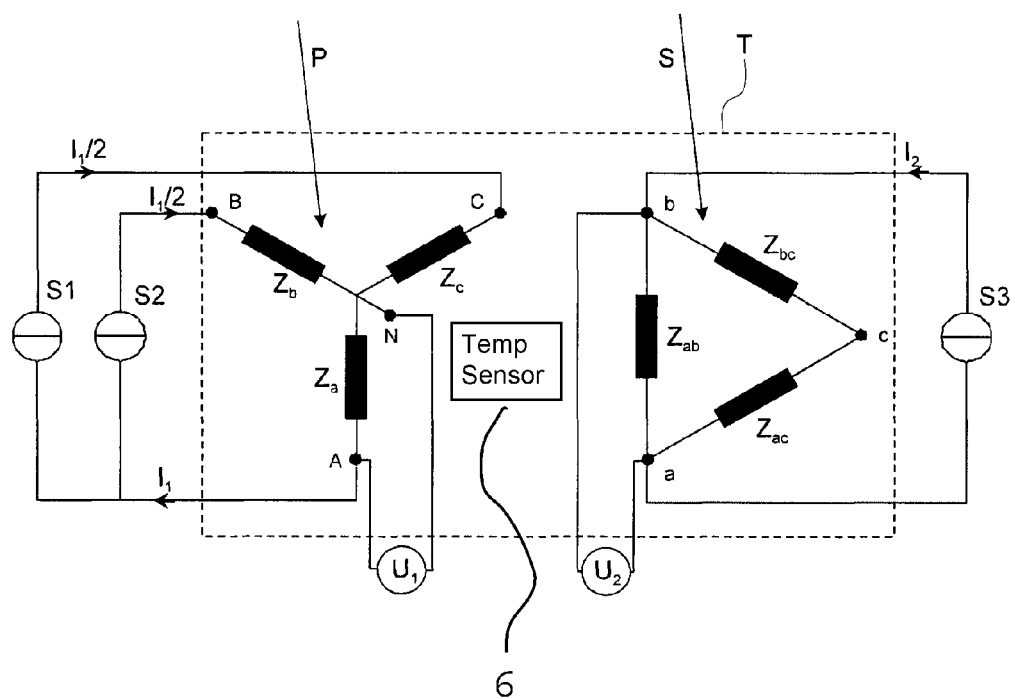
FIG. 1 shows in a first embodiment a schematic of the circuitry for carrying out the measurement method with a first, a second and a third current source connected to a 'YNd'-transformer.

FIG. 1 shows an example of the measurement method in a first embodiment of the apparatus according to the invention with a first, a second and a third current source S1, S2, S3 connected to a 'YNd'-three-phase transformer T. The primary side or high voltage side of the transformer is denoted by P and the secondary side or low voltage side is denoted by S. In this exemplary configuration, the primary side P has a star topology, wherein A, B, C denote phase ends of the three phases and N denotes a neutral reference node. $Z_a$, $Z_b$, $Z_c$ illustrate the impedances of the winding of each phase. The impedances are to be seen as a resistance R and an inductance L coupled in series, as known. The topology of the secondary side S is in this exemplary case a Delta topology having three nodes a, b, c, each of which connects two legs of this Delta-layout. $Z_{ab}$, $Z_{bc}$, $Z_{ac}$ illustrate the impedances of the winding of each leg. The impedances are also to be seen as a resistance R and an inductance L coupled in series, as known.

On the primary side P, the first current source S1 is connected between the phase ends A and C of the transformer T. It generates a first constant measuring current (DC current) $I_1/2$ which flows into the phase end C. Accordingly, a second current source S2 is connected between the phase ends A and B of the primary side P of the transformer T. It generates a second constant current (DC current) $I_1/2$ which flows into the phase end B. It is preferred that both generated currents have substantially the same value, it is however possible to choose different currents. With the first and the second measuring currents flowing into the respective phase ends, the result is a current $I_1$ flowing out of the phase end A and amounting to the sum of the first and the second measuring currents, as known. A first voltage measurement device measures the voltage drop $U_1$ on the impedance $Z_a$.

On the secondary side S, the third current source S2 is connected between the nodes a and b. It generates a third constant current (DC current) $I_2$ which flows into the node b. A second voltage measurement device measures the voltage drop $U_2$ on the impedance $Z_{ab}$.

The measurement procedure for measuring the winding resistance of the transformer will be explained in the following. The first and second simultaneously connected current sources S1, S2 are used to drive the desired measuring current and to establish such a magnetic flux in the transformer core, that the transformer core is saturated. The measurement procedure can be carried out in two ways, wherein a first variant of the procedure is described in the following and a second, alternative variant of the procedure is described thereafter.

The first measurement procedure consists of the following steps; first, the measuring current in the high voltage winding on the primary side P is applied in a special way; in this example the first and the second measuring currents are equal and amount to $I_1/2$ and the saturation current leaving the phase end A equals $I_1$, as already stated. This generates a flux distribution in the transformer core, which is equal to the flux distribution generated when applying an appropriate current in the low voltage delta winding. Using this supply scheme, all three transformer core legs can be saturated. This is accomplished by applying at least the primary side P saturation current $I_1$, which is inherently smaller than a current which would have to be applied on the secondary side S in order to saturate the transformer's core. In a second step, the third measuring current $I_2$ in the secondary side S winding is applied as known by the skilled person. Since at this moment the core of the transformer is already saturated by the already applied currents on the primary side P, the winding inductances are much lower. This leads to a much smaller time constant $\tau=L/R$ for the delta balancing process. After the inductive voltage drop has decreased to zero, the correct DC resistance of the windings can be measured by means of the voltage measurement device. As the corresponding currents are known, the DC resistance can be calculated as $R_1=U_1/I_1$ and $R_2=U_2/I_2$.

Contrary to the first variant of the measurement procedure described above, in the case of which a convenient magnetic flux is established in the transformer core, the second variant aims to eliminate the magnetic flux in the core. The device used for the second variant is the same as for the first variant, thus there are no structural modifications of it. The magnetic flux in the core is eliminated by supplying the primary and the secondary windings of the transformer in an opposite way. Thus, the first, second and third measuring currents are applied such that the amount of the sum $I_1$ of the first and the second measuring currents is substantially equal to the amount of the third measuring current $I_2$ corrected by the turns ratio $\gamma$ and the vector group of the transformer. In the context of the present invention the term "corrected" means "multiplied by a factor". For example, in case of a YNd-transformer of the example illustrated in the FIG. 1 the relationship between the currents $I_1$ and $I_2$ are given by the equation: $I_1=(\frac{2}{3}*I_2)/\gamma$. Thus, $I_1$ is substantially equal to two-thirds $I_2$ divided by the turns ratio $\gamma$ of the transformer. In case of a YNYN- or DD-transformer they satisfy the equation: $I_1=I_2/\gamma$ and in case of a Dyn-transformer they are given by the equation: $I_1=(3/2*I_2)/\gamma$.

Said currents $I_1$, $I_2$ flow in the same direction, wherein the same direction can for example be defined as equal flow directions of $I_1$ through the first leg A and $I_2$ through the leg between the two nodes a, b comprising the third current source S3. In other words, the first and the second current sources S1, S2 supply currents $I_1/2$ in a direction opposite to the direction indicated in FIG. 1, or the third current source S3 supplies the current $I_2$ in a direction opposite to the direction indicated in FIG. 1. Thus, either both currents $I_1$ and $I_2$ flow clockwise or they flow counter clockwise with respect to the illustration in FIG. 1. The advantage of this special way of supplying the currents to the primary and the secondary windings of the transformer is that the exponentially decreasing balancing process is eliminated in case of low voltage delta winding. Because there is no inductive component in the winding at all, the resistance can be measured in an easy and fast way according to the same scheme used in the first variant.

It is to be noted that the transformer core is not depicted here for clarity reasons; this is however known to the skilled person in transformers. Furthermore, the apparatus shown in FIG. 1 is shown in a simplified manner, only with the elements which are relevant for the explanation of the operating principle. A more detailed description of a preferred embodiment of the apparatus is given in the following.

Figure 2:
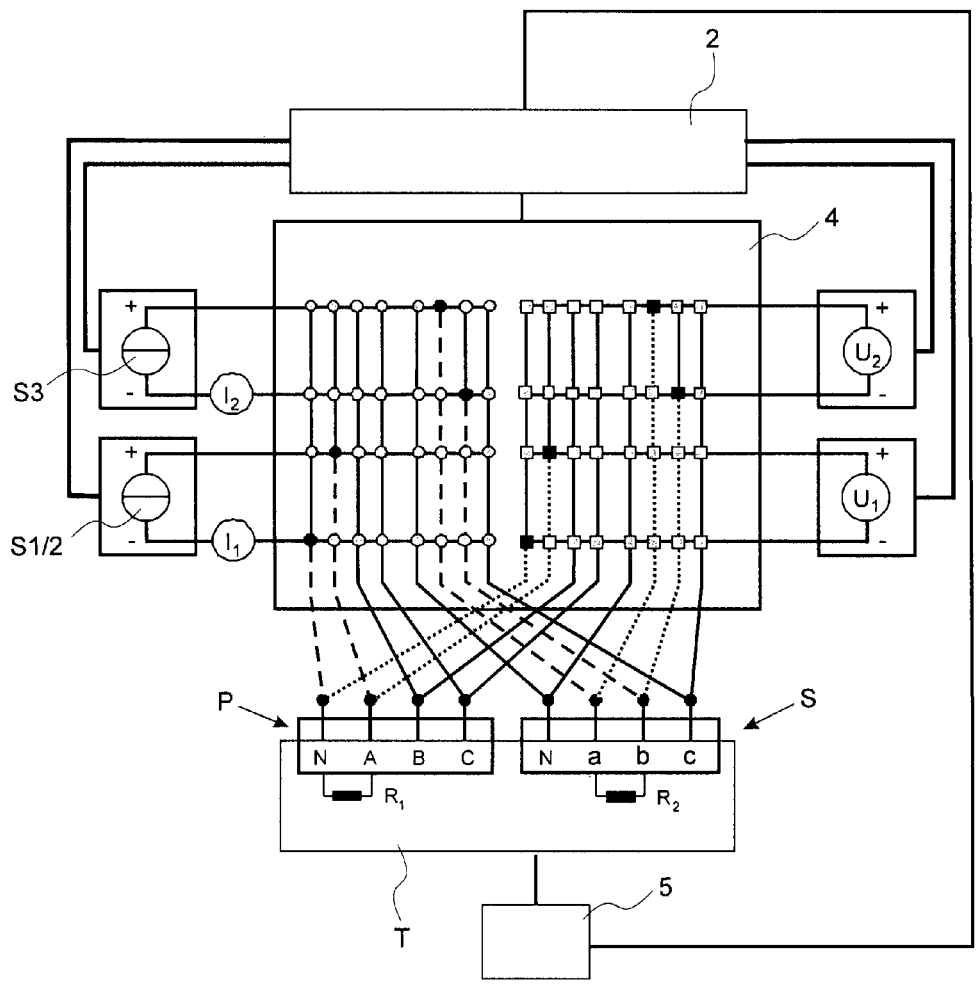
FIG. 2 shows a block schematic of the apparatus according to a second embodiment of the invention.

FIG. 2 shows a block schematic of the apparatus according to a second embodiment of the invention, which is connected to a three-phase 'YNd'-transformer T. The transformer has a primary, high voltage side P and a secondary low voltage side S. The primary side has a star topology, wherein A, B, C denote phase ends of the three phases and N denotes an optional neutral reference node. The topology of the secondary side S is in this exemplary case a Delta topology having three nodes a, b, c, each of which connects two legs of the Delta-layout and an optional neutral reference point N. The topology of the transformer can be seen in a schematic illustration in FIG. 1. In FIG. 2, the apparatus of FIG. 1 is extended by a multiplexer 4 connecting the DC current sources S1, S2, S3 to the transformer. The multiplexer 4 comprises a connection matrix denoted by circles and squares and their interconnections in FIG. 2. This switching connection matrix allows a plurality of different, selectable connections between the current sources S1, S2, S3, phases of the transformer, as well as different connections of the voltage measurement devices to different windings. Thus, the first, the second and the third measuring DC currents are applied via the multiplexer 4 connecting the DC current sources S1, S2, S3 to the transformer. In a preferred embodiment, the multiplexer 4 is configured programmatically by specifying at least a connection type and a phase shift of the transformer and subsequently triggering the according switching connections between inputs and outputs of the multiplexer. Thereby, as known by the skilled person, the connection type denotes the aforementioned topology of the primary and the secondary sides P, S of the transformer T to be measured. Thus, by using the multiplexer 4, the phase shift of the transformer T can be taken into account without having to manually change connections. The change of connections is required due to the fact that the transformer T has to be connected in different ways for each one of the possible phase shifts (YNd1, YNd3, YNd5, YNd7, YNd9 and YNd11) such that the flux distribution on the high and low voltage winding are matching. In other words, the multiplexer 4 has been configured, previously to applying the measuring currents, by switching such a connection of the DC current sources S1, S2, S3 to the transformer T that a certain phase shift configuration of the transformer T is taken into account.

This wiring configuration is preferably done by means of a control system 2 connected to the multiplexer 4. The control system 2 is also connected to the first and/or the second and/or the third DC current source S1, S2, S3 and to the first and/or the second voltage measurement device. In order to set the correct configuration in a comfortable way, the control system 2 comprises a graphical user interface by means of which at least a measurement configuration parameter, like said transformer topology, is selectable by an operator. Another parameter is the phase shift, which, once chosen, triggers an automatic configuration of said switches of the configuration matrix in the correct way. Further possible parameters are the DC measuring current values, which may then be programmed to the individually programmable DC current sources S1, S2, S3. Voltage values measured by the voltage measurement devices, as set out in the description of FIG. 1, may be transferred to the control system 2, which then calculates the winding resistance R1, R2 and displays the result on the graphical user interface.

In a preferred embodiment, the apparatus further comprises at least a temperature sensor 6 by means of which the temperature of a winding is measurable. In this application, the temperature sensors play an important role in the calculation of the winding resistance because this resistance depends to an extent on the temperature of the wiring. That is, the more the temperature rises, the more the resistance increases. Thus, the measured value for the winding resistance is corrected by taking into account a respective winding temperature measured by means of the at least one temperature sensor 6. Certainly, the temperature sensors comprise connection means to connect them to the control system 2 in order to read the temperature values.

In a further preferred embodiment, the measurement apparatus further comprises a demagnetization circuit 5 by means of which the magnetization of the transformer's core is substantially eliminated. Subsequent measurements (like turns ratio or frequency response) are carried out after having demagnetized the transformer core such that substantially an entire magnetic remanence is eliminated. This function advantageously improves the accuracy of the subsequent measurements. The demagnetization circuit 5 is preferably connected to the control system 2.

FIG. 2 illustrates how the connection matrix is switched in order to reach the measurement configuration of FIG. 1. The first and the second DC current sources S1, S2 are coupled to the primary side legs of the transformer by the corresponding dashed lines in connection with the black dots. The same applies to the third current source S3, which is connected to the corresponding secondary side nodes. In this example, there is one current measurement device for each one of the currents I1 and I2 present. They can be used as a feedback of the real value of the measuring currents, and may thus be used to fine tune the programmable current sources S1, S2, S3. The voltage measurement devices U1 and U2 are switched to measure the voltage drop on the resistances R1 and R2, which stand for the winding resistances, by means of the dotted lines in connection with the black squares.

The method and the apparatus offer a solution capable of achieving the performance of high measuring currents, however with significantly lower measuring currents. In particular they allow using a current which can be smaller than the saturation current of the low voltage side of the transformer. As a result, not only is the apparatus significantly smaller than known measurement devices but it is also cheaper because there is no need for generating very high currents. The larger the transformer is, the more does this improvement over the state of the art come into account. Particularly the use of at least two individually programmable measuring current sources on the primary side of the transformer makes it possible to divide the total necessary saturation current such that each current source can be downsized. Finally, the measurement time is considerably decreased because the transformer core can be saturated faster.

While there are shown and described presently preferred embodiments of the invention, it is to be distinctly understood that the invention is not limited thereto but may be otherwise variously embodied and practiced within the scope of the following claims.

The invention claimed is:

1. An apparatus for measuring at least a winding resistance of windings in a delta-connected transformer, comprising:
   at least a first and a second DC current source connectable each between phase ends of a first and a second leg respectively of a primary side of the transformer;
   at least a third DC current source connectable between two nodes of a secondary side of the transformer; and
   at least one of a first or a second voltage measurement device, wherein at least one of a first DC voltage drop on a third leg of the primary side is measurable by the first voltage measurement device or a second DC voltage drop on a leg of the secondary side of the transformer is measurable by the second voltage measurement device, whereby voltages in the transformer are generated in response to a first and a second measuring current applied by the first and the second DC current source to each one of two corresponding legs of the primary side of the transformer and a third measuring current applied by the third DC current source between two nodes of a pair of windings on the secondary side of the transformer, and the winding resistance of the windings in the transformer is determined based on voltage measurements provided by at least one of the first or second voltage measurement device.

2. The apparatus according to claim 1, wherein the first and the second current source deliver equal measuring DC currents.

3. The apparatus according to claim 1, wherein a total current delivered by both the first and the second current sources, the total current being a sum of a first measuring current and a second measuring current, is substantially equal to a third measuring current, corrected by the turns ratio and a vector group of the transformer, delivered by the third current source and the total of the first and second measuring currents flows in an opposite direction to the third measuring current in such a way that no magnetic flux is generated in a core of the transformer.

4. The apparatus according to claim 1, further comprising at least a temperature sensor by means of which the temperature of a winding is measurable.

5. The apparatus according to claim 1, comprising a multiplexer connecting the first, second and third DC current sources to selectable phases of the transformer, and connecting at least one of the first or the second voltage measurement device to selectable phases of the transformer.

6. The apparatus according to claim 5, further comprising a control system connected to the multiplexer.

7. The apparatus according to claim 6, wherein the control system comprises a graphical user interface by means of which at least a measurement configuration parameter is selectable by an operator.

8. The apparatus according to claim 6, wherein at least one of a first or a second measuring current delivered by a respective one of the first or the second current source is adjustable by the control system.

9. The apparatus according to claim 5, wherein a wiring configuration of the multiplexer is configurable by the control system.

10. The apparatus according to claim 1, further comprising a demagnetization circuit by means of which the magnetization of a core of the transformer is substantially eliminated.

11. A method for measuring a winding resistance of windings in Delta-connected transformer, comprising:
applying a first and a second measuring current to each one of two corresponding legs of a primary side of the transformer by means of a first and a second DC current source, respectively;
applying a third measuring current between two nodes of a pair of windings on a secondary side of the transformer by means of a third current source, said first, second and third measuring currents inducing a voltage in the transformer; and
measuring at least one of a winding resistance of the winding between said nodes on the secondary side of the transformer or the winding resistance of a leg of the primary side as soon as an inductive voltage drop in the windings substantially equals zero.

12. The method according to claim 11, wherein a total current delivered by both the first and the second current sources, and the third measuring current delivered by the third current source are adjusted in such a way that the total of the first and second measuring currents is substantially equal to the third measuring current corrected by the turns ratio and a vector group of the transformer and that the total of the first and second measuring currents flows in an opposite direction to the third measuring current in such a way that no magnetic flux is generated in a core of the transformer.

13. The method according to claim 11, wherein the first, the second and the third measuring DC currents are applied via a multiplexer connecting the DC current sources to the transformer.

14. The method according to claim 13, wherein the multiplexer has been configured, previously to applying the first, second and third measuring currents, by switching such a connection of the first, second and third DC current sources to the transformer that a phase shift configuration of the transformer is taken into account.

15. The method according to claim 13, wherein the multiplexer is configured programmatically by specifying at least a connection type and a phase shift of the transformer and subsequently triggering the according switching connections between inputs and outputs of the multiplexer.

16. The method according to claim 11, wherein the measure for the winding resistance is corrected by taking into account a respective winding temperature measured by means of at least a temperature sensor.

17. The method of claim 11, wherein the transformer is in a generator or motor.

* * * * *